(12) United States Patent
Cheng

(10) Patent No.: US 12,557,349 B2
(45) Date of Patent: Feb. 17, 2026

(54) SEMICONDUCTOR STRUCTURE AND MANUFACTURING METHOD THEREFOR

(71) Applicant: ENKRIS SEMICONDUCTOR, INC., Jiangsu (CN)

(72) Inventor: Kai Cheng, Jiangsu (CN)

(73) Assignee: ENKRIS SEMICONDUCTOR, INC., Jiangsu (CN)

( * ) Notice: Subject to any disclaimer, the term of this patent is extended or adjusted under 35 U.S.C. 154(b) by 779 days.

(21) Appl. No.: 17/795,481

(22) PCT Filed: Mar. 19, 2020

(86) PCT No.: PCT/CN2020/080215
§ 371 (c)(1),
(2) Date: Jul. 26, 2022

(87) PCT Pub. No.: WO2021/184299
PCT Pub. Date: Sep. 23, 2021

(65) Prior Publication Data
US 2023/0053045 A1 Feb. 16, 2023

(51) Int. Cl.
*H10D 62/10* (2025.01)
*H10D 30/01* (2025.01)
(Continued)

(52) U.S. Cl.
CPC ......... *H10D 62/102* (2025.01); *H10D 30/015* (2025.01); *H10D 30/475* (2025.01);
(Continued)

(58) Field of Classification Search
None
See application file for complete search history.

(56) References Cited

U.S. PATENT DOCUMENTS 9,337,332 B2 * 5/2016 Chu ................. H10D 30/475
9,812,540 B2 11/2017 Cheng
(Continued)

FOREIGN PATENT DOCUMENTS

CN 102709321 A 10/2012
CN 102945860 A 2/2013
(Continued)

OTHER PUBLICATIONS

State Intellectual Property Office of the People's Republic of China, Office Action and Search Report Issued in Application No. 2020800975895, Apr. 26, 2025, 13 pages. (Submitted with Machine Translation).

(Continued)

*Primary Examiner* — Khaja Ahmad
(74) *Attorney, Agent, or Firm* — Carroll, Hoette & Butscher, LLC; Christopher R. Carroll

(57) ABSTRACT

The present disclosure provides a semiconductor structure and a manufacturing method therefor. In the semiconductor structure, a semiconductor substrate, a heterojunction and an in-situ insulation layer are disposed from bottom to top, a trench is provided in the in-situ insulation layer, and a transition layer is located on at least an in-situ insulation layer, the p-type semiconductor layer is located in the trench and on the gate region of the transition layer, and the heavily doped n-type layer is located on at least one of the p-type semiconductor layer in the gate region, the source region of the heterojunction, or the drain region of the heterojunction.

14 Claims, 7 Drawing Sheets

(51) Int. Cl.
  *H10D 30/47* (2025.01)
  *H10D 62/85* (2025.01)
  *H10D 64/01* (2025.01)
  *H10D 64/23* (2025.01)

(52) U.S. Cl.
  CPC ......... *H10D 62/8503* (2025.01); *H10D 64/01* (2025.01); *H10D 64/258* (2025.01)

(56) References Cited

U.S. PATENT DOCUMENTS

| | | | |
|---|---|---|---|
| 10,211,305 B2* | 2/2019 | Baines | H10D 62/235 |
| 10,622,456 B2 | 4/2020 | Ni et al. | |
| 2015/0053921 A1 | 2/2015 | Cheng | |
| 2016/0233328 A1* | 8/2016 | Cheng | H01L 21/0254 |
| 2019/0267468 A1 | 8/2019 | Ni et al. | |
| 2020/0111876 A1 | 4/2020 | Wang et al. | |
| 2020/0119177 A1 | 4/2020 | Cheng | |
| 2020/0203506 A1 | 6/2020 | Ni et al. | |
| 2021/0399125 A1* | 12/2021 | Huang | H10D 30/015 |

FOREIGN PATENT DOCUMENTS

| | | | | |
|---|---|---|---|---|
| CN | 107680998 A | * | 2/2018 | ........... H10D 30/015 |
| CN | 107946358 A | | 4/2018 | |
| CN | 108155099 A | | 6/2018 | |
| CN | 108649071 A | | 10/2018 | |
| CN | 109346522 A | | 2/2019 | |
| WO | 2009113612 A1 | | 9/2009 | |
| WO | 2018223387 A1 | | 12/2018 | |

OTHER PUBLICATIONS

ISA State Intellectual Property Office of the People's Republic of China, International Search Report Issued in Application No. PCT/CN2020/080215, Dec. 25, 2020, WIPO, 2 pages.

ISA State Intellectual Property Office of the People's Republic of China, Written Opinion of the International Searching Authority Issued in Application No. PCT/CN2020/080215, Dec. 25, 2020, WIPO, 7 pages. (Submitted with Machine/Partial Translation).

* cited by examiner

SEMICONDUCTOR STRUCTURE AND MANUFACTURING METHOD THEREFOR

CROSS-REFERENCE TO RELATED APPLICATIONS

This application is a national phase entry of and claims priority to International Patent Application No. PCT/CN2020/080215 (filed 19 Mar. 2020), the entire disclosure of which is incorporated herein by reference.

TECHNICAL FIELD

The present disclosure relates to the field of semiconductor technology, and in particular, to a semiconductor structure and a manufacturing method therefor.

BACKGROUND

Wide-bandgap semiconductor material Group III nitride, as a typical representative of the third-generation semiconductor materials, have excellent characteristics of large bandgap, high pressure resistance, high temperature resistance, high electron saturation velocity and drift velocity, and easy formation of high-quality heterostructure, and thus are very suitable for manufacturing of electronic devices with high temperature, high frequency and large power.

For example, AlGaN/GaN heterojunctions are widely applied to semi-conductor structures such as High Electron Mobility Transistors (HEMT) due to high-concentration two-dimensional electron gas (2DEG) existing at an AlGaN/GaN interface caused by relatively strong spontaneous polarization and piezoelectric polarization.

Enhanced devices are widely applied in the field of power electronics due to their often off characteristics. The enhanced devices may be implemented in many manners. For example, the 2DEG is depleted by disposing a p-type semi-conductor at a gate electrode.

SUMMARY

However, the inventor of the present disclosure finds that in the method of implementing an enhanced device by disposing a p-type semiconductor at a gate electrode, the threshold voltage of the enhanced device is relatively small, and the method is required to etch the p-type semiconductor outside a gate region, but the etching will inevitably bring etching loss. In addition, the ohmic contact layer needs to be formed by high temperature annealing, which affects the performance of the semiconductor structure.

In order to solve the above problems, a first aspect of the present disclosure provides a semiconductor structure, including:
a semiconductor substrate, a heterojunction, and an in-situ insulation layer disposed from bottom to top;
a trench penetrating through the in-situ insulation layer;
a transition layer located on at least the in-situ insulation layer;
a p-type semiconductor layer located in the trench and on a gate region of transition layer;
a heavily doped n-type layer located on the p-type semiconductor layer of the gate region, and/or on the source region of the heterojunction, and/or on the drain region of the heterojunction.

In some examples, the material of the heavily doped n-type layer includes a Group III nitride material.

In some examples, the transition layer is further located in the trench.

In some examples, p-type semiconductor layer is further provided on a non-gate region of the transition layer.

In some examples, the heterojunction includes a channel layer and a barrier layer disposed from bottom to top.

In some examples, the heavily doped n-type layer contacts the channel layer or the barrier layer.

In some examples, the heterojunction includes a Group III nitride material.

In some examples, the in-situ insulation layer is a single-layer structure, where a material of the single-layer structure includes: one of or a mixture of SiN and AlN; or the in-situ insulation layer is a multi-layer structure, where the multi-layer structure includes a SiN layer and an AlN layer disposed from bottom to top, or includes an AlN layer and a SiN layer disposed from bottom to top, or includes a SiN layer, an AlN layer and a SiN layer disposed from bottom to top;

In some examples, the transition layer is a single-layer structure, and the material of the single-layer structure includes: one of or a mixture of two or more of AlN, SiAlN, and AlGaN; or the transition layer is a multi-layer layer, where the multi-layer structure includes: at least two layers of an AlN layer, a SiAlN layer, or an AlGaN layer.

In some examples, the semiconductor structure further includes: a gate electrode located on the heavily doped n-type layer in the gate region, a source electrode located on the heavily doped n-type layer in the source region, and a drain electrode located on the heavily doped n-type layer in the drain region.

A second aspect of the present disclosure provides a method of manufacturing a semiconductor structure, including:
providing a semiconductor substrate, where a heterojunction is formed on the semiconductor substrate;
forming an in-situ insulation layer on the heterojunction;
forming a trench penetrating through the in-situ insulation layer;
forming a transition layer in the trench and on the in-situ insulation layer, and a p-type semiconductor layer on the transition layer;
forming a heavily doped n-type layer on the p-type semiconductor layer in a gate region, and/or on a source region of the heterojunction, and/or on a drain region of the heterojunction.

In some examples, the material of the heavily doped n-type layer includes a Group III nitride material.

In some examples, the manufacturing method further includes: patterning the p-type semiconductor layer, and retaining the p-type semiconductor layer in the gate region.

In some examples, the heterojunction includes a channel layer and a barrier layer disposed from bottom to top.

In some examples, the heavily doped n-type layer contacts the channel layer or the barrier layer.

In some examples, the heterojunction includes a Group III nitride material.

In some examples, the in-situ insulation layer is a single-layer structure, where a material of the single-layer structure includes: one of or a mixture of SiN and AlN; or the in-situ insulation layer is a multi-layer structure, where the multi-layer structure includes a SiN layer and an AlN layer disposed from bottom to top, or includes an AlN layer and a SiN layer disposed from bottom to top, or includes a SiN layer, an AlN layer and a SiN layer disposed from bottom to top;

In some examples, the transition layer is a single-layer structure, and the material of the single-layer structure includes: one of or a mixture of two or more of AlN, SiAlN, and AlGaN; or the transition layer is a multi-layer layer, where the multi-layer structure includes: at least two layers of an AlN layer, a SiAlN layer, and an AlGaN layer.

In some examples, the method further includes: forming a gate electrode on the heavily doped n-type layer in the gate region, forming a source electrode on heavily doped n-type layer in the source region, and forming a drain electrode on heavily doped n-type layer in the drain region.

A third aspect of the present disclosure provides a method of manufacturing a semiconductor structure, including:
providing a semiconductor substrate, where a heterojunction is formed on the semiconductor substrate;
forming an in-situ insulation layer on the heterojunction and a transition layer on the in-situ insulation layer;
forming a trench penetrating through the in-situ insulation layer and the transition layer;
forming a p-type semiconductor layer in the trench and on the transition layer;
forming a heavily doped n-type layer on the p-type semiconductor layer in a gate region, and/or on a source region of the heterojunction, and/or on a drain region of the heterojunction.

In some examples, the material of the heavily doped n-type layer includes a Group III nitride material.

In some examples, the manufacturing method further includes: patterning the p-type semiconductor layer, and retaining the p-type semiconductor layer in the gate region.

In some examples, the heterojunction includes a channel layer and a barrier layer disposed from bottom to top.

In some examples, the heavily doped n-type layer contacts the channel layer or the barrier layer.

In some examples, the heterojunction includes a Group III nitride material.

In some examples, the in-situ insulation layer is a single-layer structure, where a material of the single-layer structure includes: one of or a mixture of SiN and AlN; or the in-situ insulation layer is a multi-layer structure, where the multi-layer structure includes a SiN layer and an AlN layer disposed from bottom to top, or includes an AlN layer and a SiN layer disposed from bottom to top, or includes a SiN layer, an AlN layer and a SiN layer disposed from bottom to top;

In some examples, the transition layer is a single-layer structure, and the material of the single-layer structure includes: one of or a mixture of two or more of AlN, SiAlN, and AlGaN; or the transition layer is a multi-layer layer, where the multi-layer structure includes: at least two layers of an AlN layer, a SiAlN layer, or an AlGaN layer.

In some examples, the method further includes: forming a gate electrode on the heavily doped n-type layer in the gate region, forming a source electrode on heavily doped n-type layer in the source region, and forming a drain electrode on heavily doped n-type layer in the drain region.

Compared with the prior art, the present disclosure has the following beneficial effects:

1) The semiconductor structure of the present disclosure includes: a semiconductor substrate, a heterojunction, an in-situ insulation layer, a transition layer, a p-type semiconductor layer and a heavily doped n-type layer, where the semiconductor substrate, the heterojunction and the in-situ insulation layer are disposed from bottom to top, a trench is provided in the in-situ insulation layer, the transition layer is located at least on the in-situ insulation layer outside the trench, the p-type semiconductor layer is located in the trench and the gate region of the transition layer, a heavily doped n-type layer is located on the p-type semiconductor layer in the gate region, and/or on the source region of the heterojunction, and/or on the drain region of the heterojunction. The transition layer facilitates the formation of the p-type semiconductor layer outside the trench in the process. The in-situ insulation layer and the transition layer can reduce the gate leakage current leaked from the channel to the gate in the device, so the thickness of the barrier layer in the heterojunction can be smaller, thereby increasing the threshold voltage; in addition, because the in-situ insulation layer is provided, the sheet resistance can be reduced, the concentration of the two-dimensional electron gas is increased, the control ability of the gate to the channel is improved, and the working current is increased.

Because the transition layer is provided, on the one hand, the selective growth of p-type semiconductor on the in-situ insulation layer can be avoided, thereby improving the quality of the p-type semiconductor layer, and on the other hand, it can be prevented that atoms (such as Si atoms) in the in-situ insulation layer diffuses into the p-type semiconductor layer and affects the p-type semiconductor layer.

The heavily doped n-type layer enables that an ohmic contact layer is directly formed between the source electrode and the source region of the heterojunction, between the drain electrode and the drain region of the heterojunction, and between the gate electrode and the p-type semiconductor layer in the gate region, without high temperature annealing.

2) In an example, the heterojunction includes a channel layer and a barrier layer disposed from bottom to top. Specifically, a) the heterojunction includes one channel layer and one barrier layer; or b) the heterojunction includes a plurality of channel layers and a plurality of barrier layers, which are distributed alternately; or c) the heterojunction includes one channel layer and two or more barrier layers to satisfy different functional requirements.

3) In an example, the heterojunction includes a Group III nitride material. The Group III nitride material may include any one or a combination of GaN, AlGaN, and AlInGaN. The semiconductor structure of the present disclosure is highly compatible with existing HEMT devices.

4) In an example, the p-type semiconductor layer includes a Group III nitride material. The material of the transition layer includes: at least one of AlN, SiAlN, or AlGaN. The Group III nitride material may include any one or a combination of GaN, AlGaN, and AlInGaN. The transition layer is formed by an in-situ growth process, which can improve the quality of the subsequent p-type semiconductor layer.

5) In an example, the p-type semiconductor layer is also provided on the non-gate region of the transition layer. In other words, the p-type semiconductor layer on the transition layer can be patterned to only retain the p-type semiconductor layer in the gate and deplete the excess two-dimensional electron gas under the gate electrode; due to the existence of the in-situ insulation layer and the transition layer, the p-type semiconductor layer in the non-gate region may also not be patterned, and the p-type semiconductor layer in the gate region and the non-gate region is remained in the semiconductor structure.

6) In an example, the source electrode and the drain electrode are in contact with the channel layer or the barrier layer to meet the requirements of different semiconductor structures.

Figure 1:
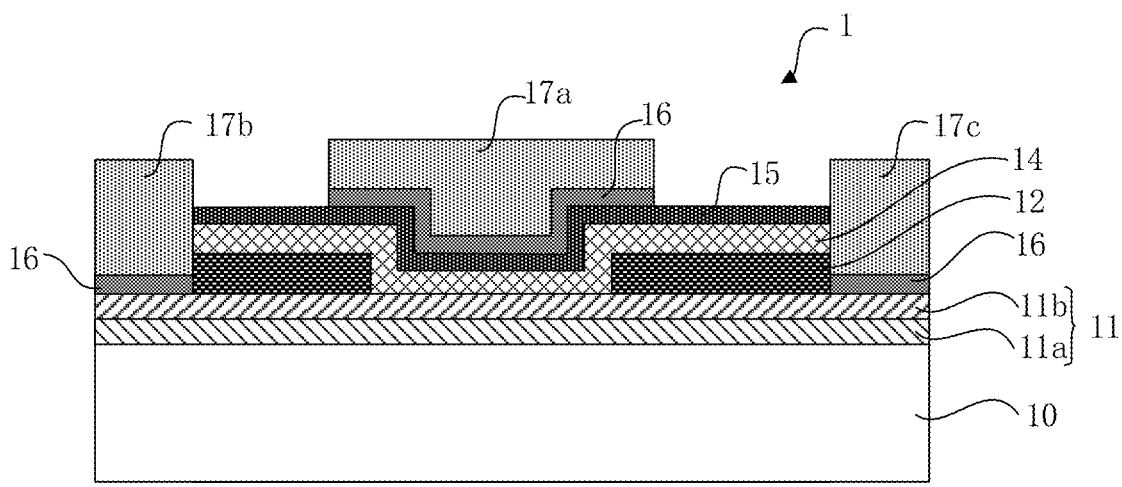
FIG. 1 is a structural diagram of a semiconductor structure according to a first embodiment of the present disclosure.

To facilitate the understanding of the present disclosure, all reference signs present in the present disclosure are listed below:

| |
|---|
| semiconductor structures 1, 2, 3, 4, 5, 6, 7, 8 |
| semiconductor substrate 10 |
| heterojunction 11 |
| in-situ insulation layer 12 |
| trench 13 |
| transition layer 14 |
| p-type semiconductor layer 15 |
| heavily doped n-type layer 16 |
| gate electrode 17a |
| source electrode17b |
| drain electrode 17c |
| channel layer 11a |
| barrier layer 11b |

DETAILED DESCRIPTION OF THE EMBODIMENTS

In order to make the above-mentioned objects, features and advantages of the present disclosure more obvious and understandable, embodiments of the present disclosure will be described in detail below with reference to the accompanying drawings.

FIG. 1 is a structural diagram of a semiconductor structure according to a first embodiment of the present disclosure.

Referring to FIG. 1, the semiconductor structure 1 includes:

a semiconductor substrate 10, a heterojunction 11, and an in-situ insulation layer 12 disposed from bottom to top;

a trench 13 (referring to FIG. 4) penetrating through in-situ insulation layer 12;

a transition layer 14 located in the trench 13 and on the in-situ insulation layer 12;

a p-type semiconductor layer 15 located on the transition layer 14;

a heavily doped n-type layer 16 located on the p-type semiconductor layer 15 in the gate region, and on a source region and a drain region of the heterojunction 11;

a gate electrode 17a located on the heavily doped n-type layer 16 in the gate region, a source electrode 17b located on the heavily doped n-type layer 16 in the source region, and a drain electrode 17c located on the heavily doped n-type layer 16 in the drain region.

The material of the semiconductor substrate 10 may include sapphire, silicon carbide, silicon, GaN or diamond.

The heterojunction 11 may include a channel layer 11a and a barrier layer 11b disposed from bottom to top. Two-dimensional electron gas may be formed at the interface between the channel layer 11a and the barrier layer 11b. In an example, the channel layer 11a is an intrinsic GaN layer, and the barrier layer 11b is an n-type AlGaN layer. In other examples, the combination of the channel layer 11a and the barrier layer 11b may also be GaN/AlN, GaN/InN, GaN/InAlGaN, GaAs/AlGaAs, GaN/InAlN or InN/InAlN. In addition to that the heterojunction 11 includes one channel layer 11a and one barrier layer 11b as shown in FIG. 1, the heterojunction 11 may include multiple channel layers 11a and multiple barrier layers 11b, which are distributed alternately; or the heterojunction 11 includes one channel layer 11a and two or more barrier layers 11b to form a multi-barrier structure.

A nucleation layer and a buffer layer (not shown in figures) may also be provided between the heterojunction 11 and the semiconductor substrate 10. A material of the nucleation layer may include, for example, AlN, AlGaN, or the like, and a material of the buffer layer may include at least one of AlN, GaN, AlGaN or AlInGaN. The nucleation layer may alleviate the problems of lattice mismatch and thermal mismatch between epitaxially-growing semiconductor layers for example, the channel layer 11a in the heterojunction 11 and the semiconductor substrate 10; and the buffer layer may decrease a dislocation density and a defect density of the epitaxially-growing semi-conductor layer so as to improve crystal quality.

The in-situ insulation layer 12 is an insulation layer formed by an in-situ growth process. One of the functions of the in-situ insulation layer 12 is to electrically insulate the gate electrode 17a outside the trench 13 and the barrier layer 11b. In the HEMT structure, the in-situ insulation layer 12 can also suppress the current collapse effect.

In an example, the in-situ insulation layer 12 is a single-layer structure, and the material of the single-layer structure includes: one of or a mixture of SiN and AlN. In another example, the in-situ insulation layer 12 is a multi-layer structure, and the multi-layer structure may include, from bottom to top, a SiN layer and an AlN layer; or include, from bottom to top, an AlN layer and a SiN layer; or include, from bottom to top, a SiN layer, an AlN layer and a SiN layer.

The transition layer 14 may be formed using an in-situ growth process. In an example, the in-situ insulation layer 14 is a single-layer structure, and the material of the single-layer structure includes: one of or a mixture of two or more of AlN, SiAlN, and AlGaN. In another example, the transition layer 14 is a multi-layer structure, and the multi-layer structure may include at least two layers of an AlN layer, a SiAlN layer, and an AlGaN layer. The transition layer 14 made of the above material can solve the problem that the p-type Group III nitride material cannot grow on the in-situ insulation layer 12, so that the p-type semiconductor layer 15 can be formed outside the trench 13.

The p-type semiconductor layer 15 can be made of a Group III nitride material, such as at least one of GaN, AlGaN, or AlInGaN, where the p-type doped ions can be magnesium ions to deplete the two-dimensional electron gas under the gate region, so as to form enhanced devices.

In the embodiment shown in FIG. 1, there is a concave region of the p-type semiconductor layer 15 corresponding to the trench 13, and a portion of the gate electrode 17a is located in the concave region. In some embodiments, the upper surface of the p-type semiconductor layer 15 and the lower surface of the gate electrode 17a may also be flat.

In FIG. 1, the source electrode 17b and the drain electrode 17c are in contact with the barrier layer 11b, and an ohmic contact may be formed both between the source electrode 17b and the barrier layer 11b and between the drain electrode 17c and the barrier layer 11b by heavily doped n-type layer 16. An ohmic contact is also formed between the gate electrode 17a and the p-type semiconductor layer 15 by the heavily doped n-type layer 16. The material of the source electrode 17b, the drain electrode 17c, and the gate electrode 17a can be metal, such as Ti/Al/Ni/Au, Ni/Au and other existing conductive materials. The heavily doped n-type layer 16 can make an ohmic contact layer be directly formed between the source electrode 17b and the source region of the heterojunction 11, between the drain electrode 17c and the drain region of the heterojunction 11, and between the gate electrode 17a and the p-type semiconductor layer 15 in the gate region, without high temperature annealing.

In some embodiments, an n-type ion heavily doped layer 16 may also be provided on at least one of the p-type semiconductor layer 15 in the gate region, the source region of heterojunction 11, or the drain region of the heterojunction 11. By high temperature annealing, an ohmic contact layer may be formed between the gate electrode 17a and the p-type semiconductor layer 15 in the gate region without the heavily doped n-type layer 16, between the source electrode 17b and the source region of the heterojunction 11 without the heavily doped n-type layer 16, and between the drain electrode 17c and the drain region of the heterojunction 11 without the heavily doped n-type layer 16.

In the heavily doped n-type layer 16, the n-type ions may include at least one of kinds of Si ions, Ge ions, Sn ions, Se ions or Te ions. For different n-type ions, the doping concentration can be greater than $1E19/cm^3$. The heavily doped n-type layer 16 may include a Group III nitride material, such as at least one of GaN, AlGaN, or AlInGaN.

In the semiconductor structure 1, the in-situ insulation layer 12 and the transition layer 14 can reduce the gate leakage current leaked from the channel to the gate electrode 17a, so the thickness of the barrier layer 11b in the heterojunction 11 can be smaller, which can decrease threshold voltage; in addition, because the in-situ insulation layer 12 is provided, the surface resistance can be reduced, the concentration of the two-dimensional electron gas is increased, and therefore the control ability of the gate to the channel is improved, and the working current is increased.

In order to verify the technical effect of the present disclosure, taking the thickness of the barrier layer 11b as 5 nm as an example. By comparing a semiconductor structure with 5 nm $Al_{0.25}GaN$ barrier layer/GaN channel layer and a semiconductor structure with 5 nm in-situ SiN layer/5 nm $Al_{0.25}GaN$ barrier layer/GaN channel layer, it is found that the sheet resistance (surface resistance) between the source electrode 17b and the drain electrode 17c can be reduced from $2300\Omega/\square$ to $325\Omega/\square$, and the two-dimensional electron gas concentration in the heterojunction 11 can be increased from $2.4E12/cm^2$ to $1.03E13/cm^2$.

In addition, in the existing HEMT structure with the AlGaN barrier layer/GaN channel layer, the thickness of the barrier layer 11b is from 15 nm to 25 nm to ensure the generation of a sufficient concentration of two-dimensional electron gas. In the present disclosure, when the thickness of the barrier layer 11b ranges is from 1 nm to 15 nm, a sufficient concentration of two-dimensional electron gas can be generated. In an example, the thickness of the barrier layer 11b can be controlled to be less than 10 nm.

Figure 2:
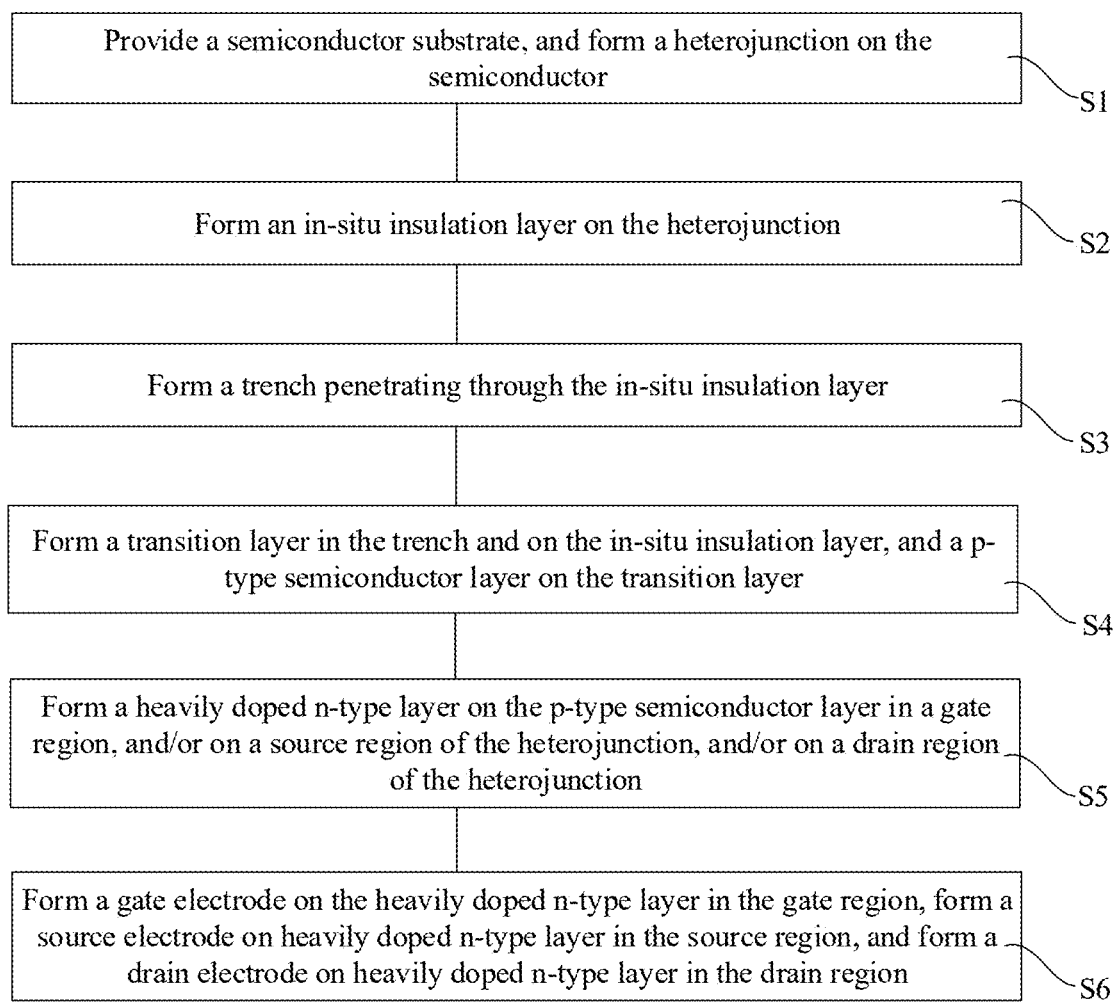
FIG. 2 is a flowchart of a method of manufacturing the semiconductor structure provided in the first embodiment of the present disclosure.
Figure 3:
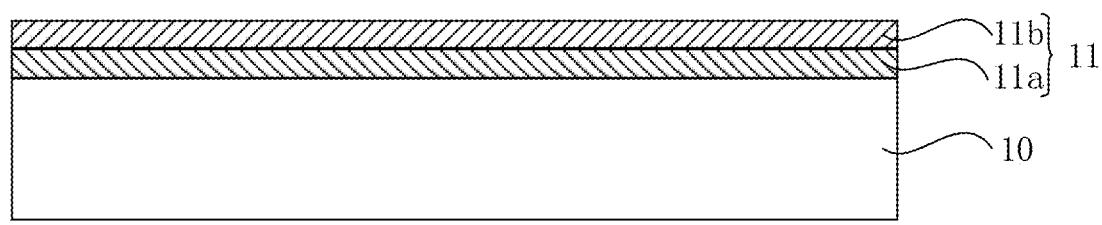
FIGS. 3 to 5 are schematic diagrams illustrating intermediate structures corresponding to the process of FIG. 2.
Figure 4:
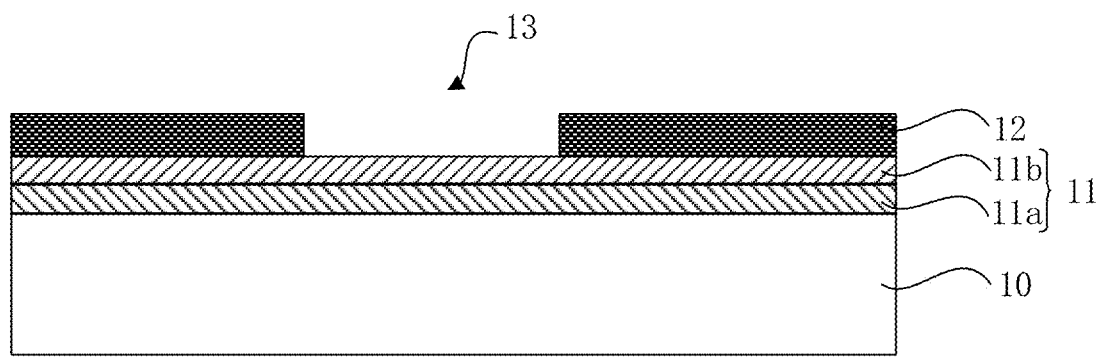
Figure 5:
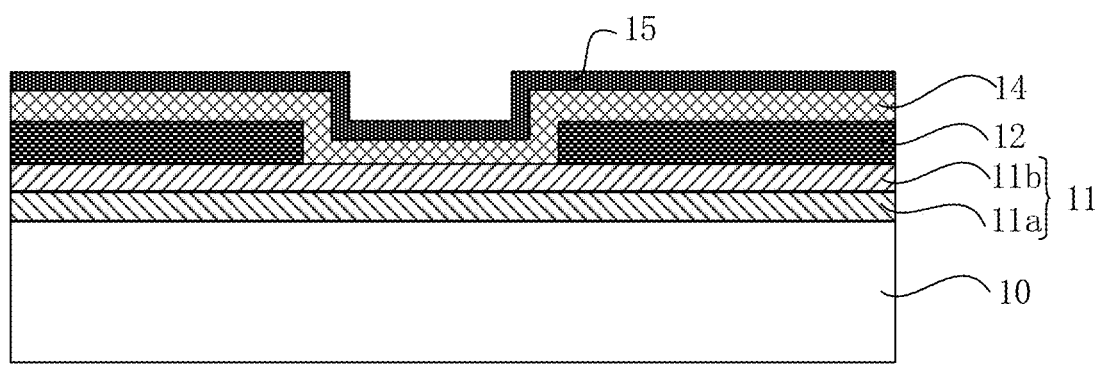

FIG. 2 is a flowchart of a method of manufacturing semiconductor structure provided in the first embodiment of the present disclosure; and FIGS. 3 to 5 are schematic diagrams illustrating intermediate structures corresponding to the process of FIG. 2.

First, referring to step S1 in FIG. 2 and FIG. 3, a semiconductor substrate 10 is provided, and a heterojunction 11 is formed on the semiconductor substrate 10.

The material of the semiconductor substrate 10 may include sapphire, silicon carbide, silicon, GaN or diamond.

The heterojunction 11 may include a channel layer 11a and a barrier layer 11b disposed from bottom to top. In an example, the channel layer 11a is an intrinsic GaN layer, and the barrier layer 11b is an n-type AlGaN layer. In other examples, the combination of the channel layer 11a and the barrier layer 11b may also be GaN/AlN, GaN/InN, GaN/InAlGaN, GaAs/AlGaAs, GaN/InAlN or InN/InAlN. Forming process for the channel layer 11a and the barrier layer 11b may include: Atomic Layer Deposition (ALD), or Chemical Vapor Deposition (CVD), or molecular beam epitaxial (MBE), or Plasma Enhanced Chemical Vapor Deposition (PECVD), or Low Pressure Chemical Vapor Deposition (LPCVD), or Metal-Organic Chemical Vapor Deposition (MOCVD), or a combination thereof.

In addition to that the heterojunction 11 shown in FIG. 1 includes one channel layer 11a and one barrier layer 11b, the heterojunction 11 may also include multiple channel layers 11a and multiple barrier layers 11b, which are distributed alternately; or the heterojunction 11 includes one channel layer 11a and two or more barrier layers 11b to form a multi-barrier structure.

Before the heterojunction 11 is formed on the semiconductor substrate 10, a nucleation layer and a buffer layer (not shown in figures) may also be provided on the semiconductor substrate 10 in sequence. A material of the nucleation layer may include, for example, AlN, AlGaN, or the like, and a material of the buffer layer may include at least one of AlN, GaN, AlGaN or AlInGaN. The formation method of the buffer layer may be the same as the formation method of the heterojunction 11. The nucleation layer may alleviate the problems of lattice mismatch and thermal mismatch between epitaxially-growing semiconductor layers for example, the channel layer 11a in the heterojunction 11 and the semiconductor substrate 10; and the buffer layer may decrease a dislocation density and a defect density of the epitaxially-growing semi-conductor layer so as to improve crystal quality.

The sheet resistance (surface resistance) of the structure shown in FIG. 3 is tested, and the size is $2300\Omega/\square$.

Next, referring to step S2 in FIG. 2 and FIG. 4, an in-situ insulation layer 12 is formed on the heterojunction 11.

The in-situ insulation layer 12 is an insulation layer formed by an in-situ growth process. In an example, the in-situ insulation layer 12 is a single-layer structure, and the material of the single-layer structure includes: one of or a mixture of SiN and AlN. In another example, the in-situ insulation layer 12 is a multi-layer structure, and the multi-layer structure may include, from bottom to top, a SiN layer and an AlN layer; or include, from bottom to top, an AlN layer and a SiN layer; or include, from bottom to top, a SiN layer, an AlN layer and a SiN layer.

Then, referring to step S3 in FIG. 2 and FIG. 4, a trench 13 penetrating through the in-situ insulation layer 12 is formed.

The trench 13 can be formed by dry etching or wet etching. Specifically, a patterned mask layer is first formed on the in-situ insulation layer 12. The mask layer may be a photoresist layer, which is patterned by a process of exposing first and then developing. The gas for dry etching can be $CF_4$, $C_3F_8$, etc., and the solution for wet etching can be hot phosphoric acid.

The sheet resistance (surface resistance) of the structure shown in FIG. 4 is tested, and the size is 325Ω/□.

Next, referring to step S4 in FIG. 2 and FIG. 5, a transition layer 14 and a p-type semiconductor layer 15 are sequentially formed in the trench 13 and on in-situ insulation layer 12.

The transition layer 14 may be formed using an in-situ growth process. In an example, the in-situ insulation layer 14 is a single-layer structure, and the material of the single-layer structure includes: one of or a mixture of two or more of AlN, SiAlN, and AlGaN. In another example, the transition layer 14 is a multi-layer structure, and the multi-layer structure may include at least two layers of an AlN layer, a SiAlN layer, and an AlGaN layer.

The material of the p-type semiconductor layer 15 includes Group III nitride, for example, at least one of GaN, AlGaN, or AlInGaN, where the p-type doped ions may be magnesium ions. For the formation process of the p-type semiconductor layer 15, reference may be made to the formation process of the channel layer 11a and the barrier layer 11b.

In this embodiment, the p-type semiconductor layer 15 has a concave region corresponding to the trench 13. In some embodiments, the upper surface of the p-type semiconductor layer 15 may also be flat.

Then, referring to step S5 in FIG. 2 and FIG. 1, a heavily doped n-type layer 16 is provided on the p-type semiconductor layer 15 in the gate region, and on the source region and the drain region of the heterojunction 11.

The material of the heavily doped n-type layer 16 may include Group III nitride, such as at least one of GaN, AlGaN, or AlInGaN, where the n-type doped ions may include at least one kind of Si ions, Ge ions, Sn ions, Se ions or Te ions. The formation process of the heavily doped n-type layer 16 can be referred to the formation process of the channel layer 11a and the barrier layer 11b. The n-type ions can be doped while growing, or the n-type ions can be injected after epitaxial growth.

In some embodiments, a heavily doped n-type layer 16 may also be provided on at least one of the p-type semiconductor layer 15 in the gate region, the source region of heterojunction 11, or the drain region of the heterojunction 11.

Next, referring to step S6 in FIG. 2 and FIG. 1, a gate electrode 17a is formed on the heavily doped n-type layer 16 in the gate region, a source electrode 17b is formed on the heavily doped n-type layer 16 in the source region, and a drain electrode 17c is formed in the heavily doped n-type layer 16 in the drain region.

The material of the source electrode 17b, the drain electrode 17c, and the gate electrode 17a can be metal, such as existing conductive materials such as Ti/Al/Ni/Au, Ni/Au, etc., and the source electrode 17b, the drain electrode 17c, and the gate electrode 17a can be correspondingly formed by physical vapor deposition or chemical vapor deposition.

In this embodiment, because there is a concave region of the p-type semiconductor layer 15 corresponding to the trench 13, a portion of the gate electrode 17a is located in the concave region. In some embodiments, the upper surface of the p-type semiconductor layer 15 and the lower surface of the gate electrode 17a may also be flat.

Figure 6:
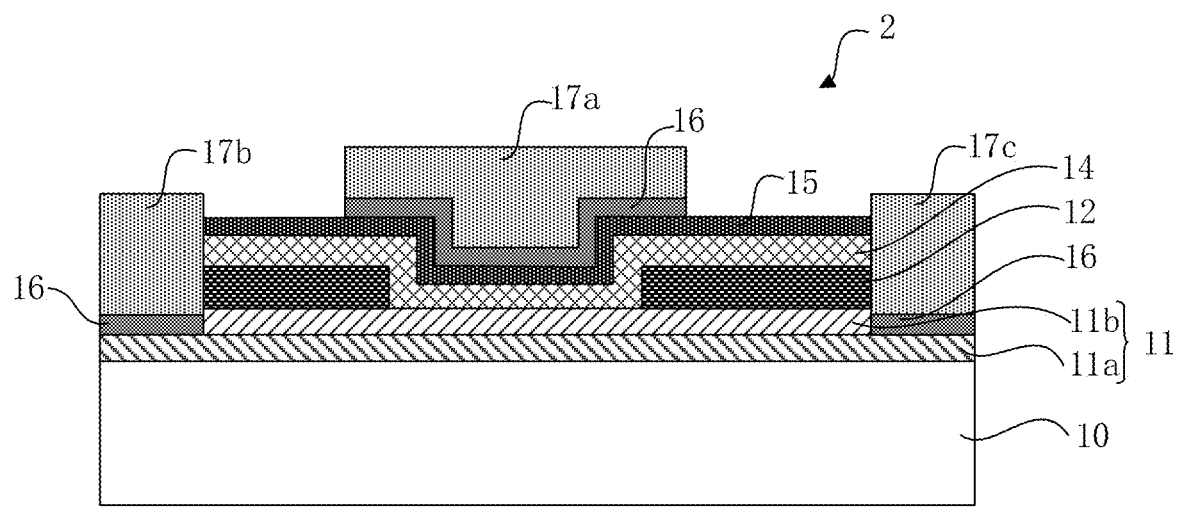
FIG. 6 is a structural diagram of a semiconductor structure according to a second embodiment of the present disclosure.

FIG. 6 is a structural diagram of a semiconductor structure according to a second embodiment of the present disclosure.

Referring to FIG. 6 and FIG. 1, the semiconductor structure 2 of the second embodiment is substantially the same as the semiconductor structure 1 of the first embodiment, except that the source electrode 17b and the drain electrode 17c are in contact with the channel layer 11a; and ohmic contact is formed, by using the heavily doped n-type ion layer 16, between the source electrode 17b and the channel layer 11a, and between drain electrode 17c and the channel layer 11a.

Correspondingly, the manufacturing method of the semiconductor structure 2 of the second embodiment is substantially the same as the manufacturing method of the semiconductor structure 1 of the first embodiment, the difference includes that in step S5, before the heavily doped n-type layer 16 is formed on the source region of the heterojunction 11 and the drain region of the heterojunction 11, the p-type semiconductor layer 15, the transition layer 14, the in-situ insulation layer 12 and the barrier layer 11b in the source region and the drain region are removed to expose the channel layer 11a. The heavily doped n-type layer 16 enables that an ohmic contact layer is directly formed without high temperature thermal annealing between the source electrode 17b and the channel layer 11a, and between the drain electrode 17c and the channel layer 11a.

In some embodiments, the source electrode 17b and the drain electrode 17c are in contact with the channel layer 11a, and ohmic contact is formed, by using the heavily doped n-type ion layer 16, between the source electrode 17b and the channel layer 11a, and between drain electrode 17c and the channel layer 11a. By high temperature annealing, an ohmic contact layer may be formed between the source electrode 17b and channel layer 11a without the heavily doped n-type layer 16, or between the drain electrode 17c and the channel layer 11a without the heavily doped n-type layer 16.

Figure 7:
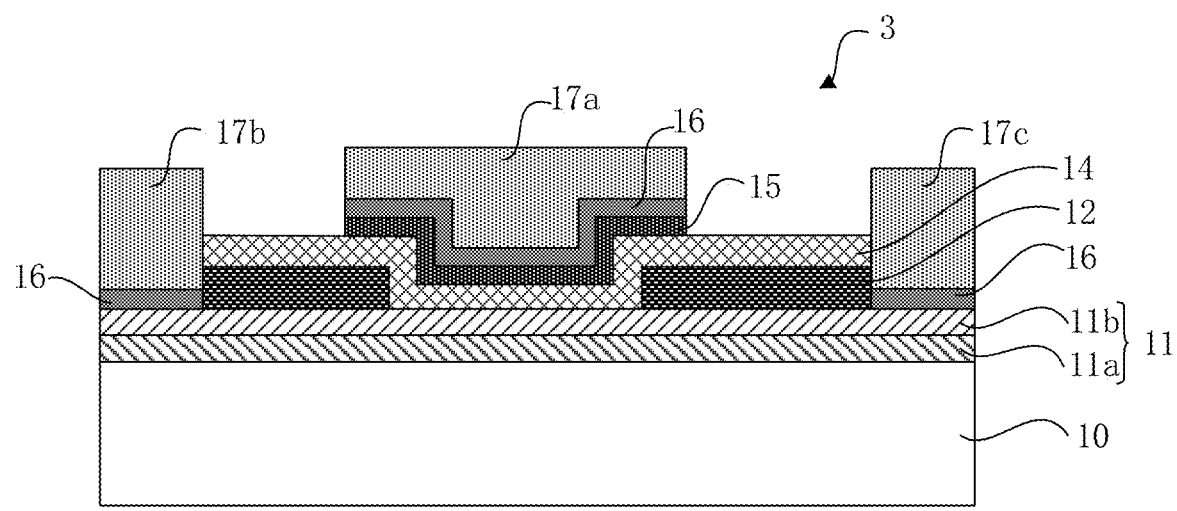
FIG. 7 is a structural diagram of a semiconductor structure according to a third embodiment of the present disclosure.
Figure 8:
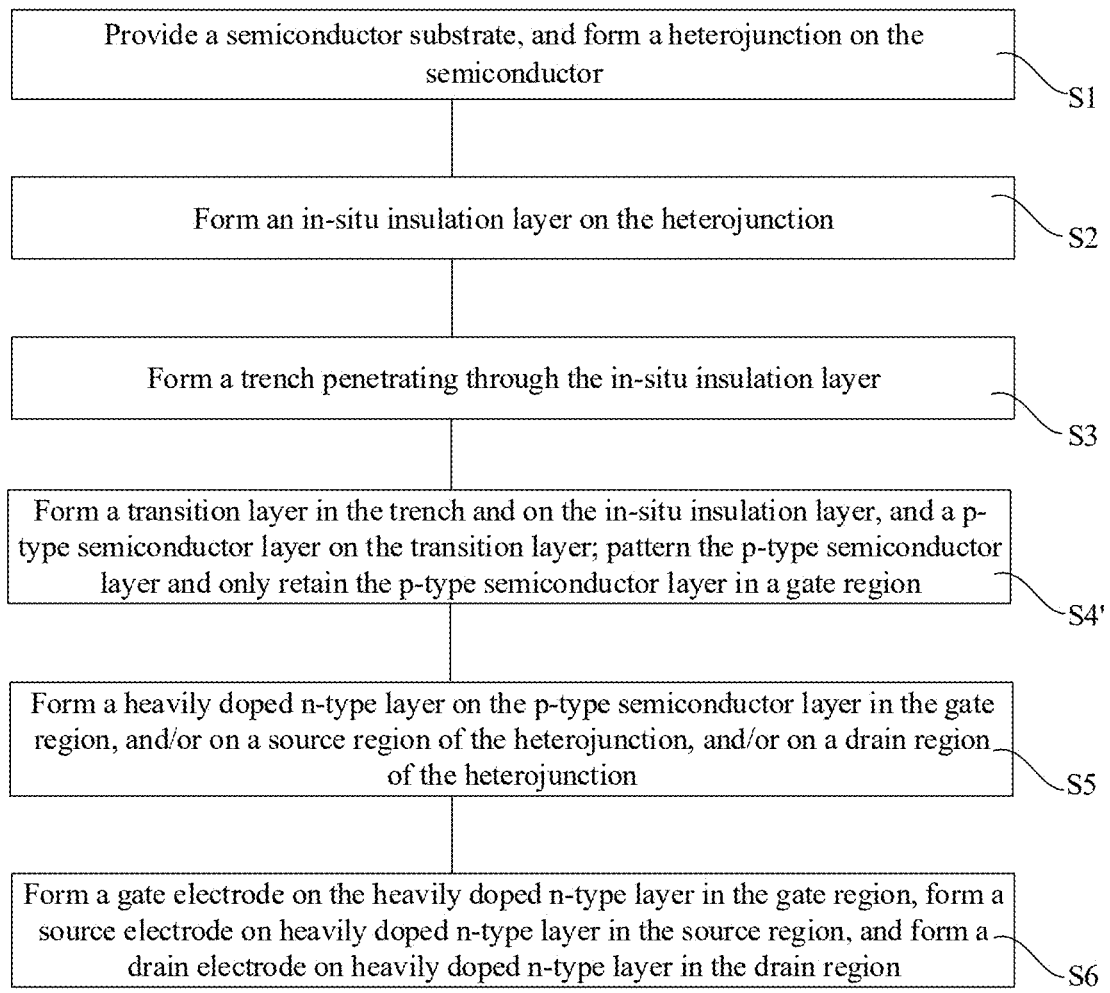
FIG. 8 is a flowchart of a method of manufacturing the semiconductor structure provided in the third embodiment of the present disclosure.

FIG. 7 is a structural diagram of a semiconductor structure according to a third embodiment of the present disclosure. FIG. 8 is a flowchart of a method of manufacturing the semiconductor structure provided by the third embodiment of the present disclosure.

Referring to FIG. 7, FIG. 1 and FIG. 6, the semiconductor structure 3 of the third embodiment is substantially the same as the semiconductor structures 1 and 2 of the first and second embodiments, the difference includes that; on the transition layer 14, the p-type semiconductor layer 15 is only provided in the gate region.

Correspondingly, referring to FIG. 8 and FIG. 2, the manufacturing method of the semiconductor structure 3 of the third embodiment is substantially the same as the manufacturing methods of the semiconductor structures 1 and 2 of the first embodiment and the second embodiment, and the difference includes that step S4' further includes a step of patterning the p-type semiconductor layer 15. In other words, step S4' includes: sequentially forming the transition layer 14 and the p-type semiconductor layer 15 in the trench 13 and on the in-situ insulation layer 12; patterning the p-type semiconductor layer 15 to only retain the p-type semiconductor layer 15 in the gate region.

Patterning p-type semiconductor layer 15 can be implemented by dry etching or wet etching. Compared with the method of patterning the p-type semiconductor layer 15 formed directly on the barrier layer 11b, the in-situ insulation layer 12 and the transition layer 14 can prevent the barrier layer 11b from being damaged by over-etching during the patterning process.

Figure 9:
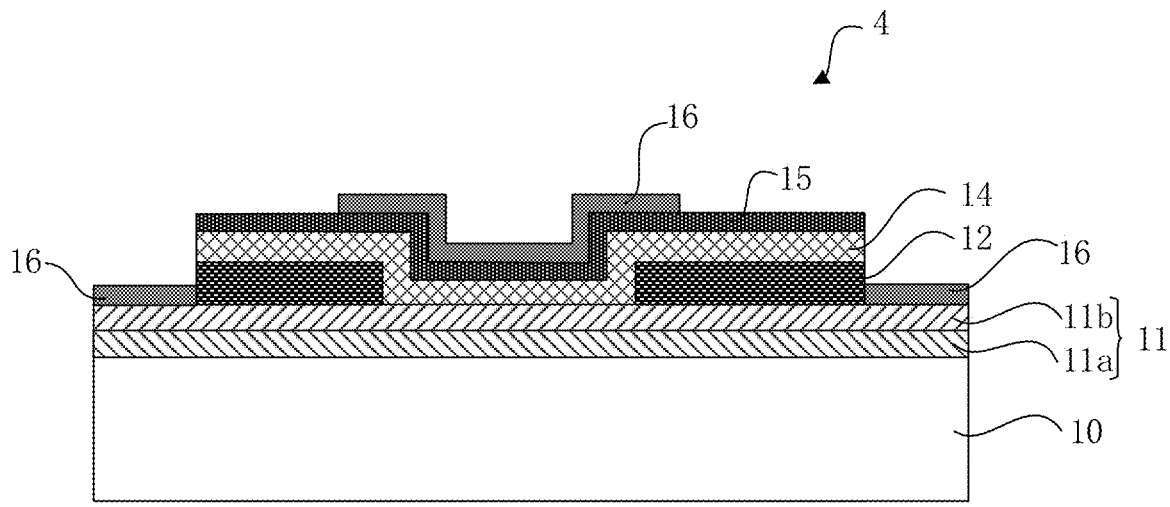
FIG. 9 is a structural diagram of a semiconductor structure according to a fourth embodiment of the present disclosure.

FIG. 9 is a structural diagram of a semiconductor structure according to a fourth embodiment of the present disclosure. Referring to FIG. 9, FIG. 1, FIG. 6 and FIG. 7, the semiconductor structure 4 of the fourth embodiment is substantially the same as the semiconductor structures 1, 2, and 3 of the first, second, and third embodiments, except that the semiconductor structure 4 is a semiconductor structure in progress, the gate electrode 17a, the source electrode 17b and the drain electrode 17c are not formed.

Correspondingly, the manufacturing method of the semiconductor structure 4 of the fourth embodiment is substantially the same as the manufacturing method of the semiconductor structures 1, 2, and 3 of the first, second, and third embodiments, and the difference includes that step S6 is omitted.

The semiconductor structure 4 can also be produced and sold as a semi-finished product.

Figure 10:
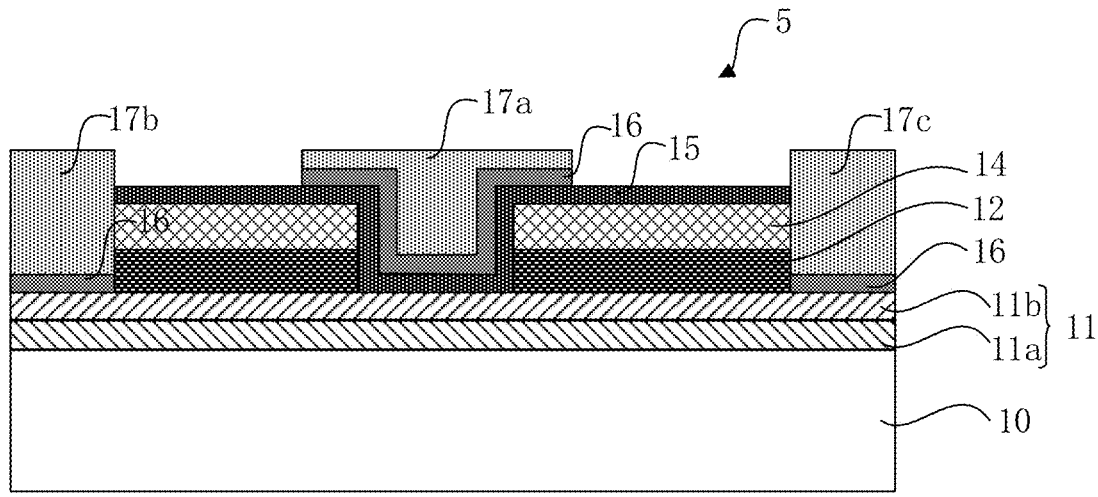
FIG. 10 is a structural diagram of a semiconductor structure according to a fifth embodiment of the present disclosure.
Figure 11:
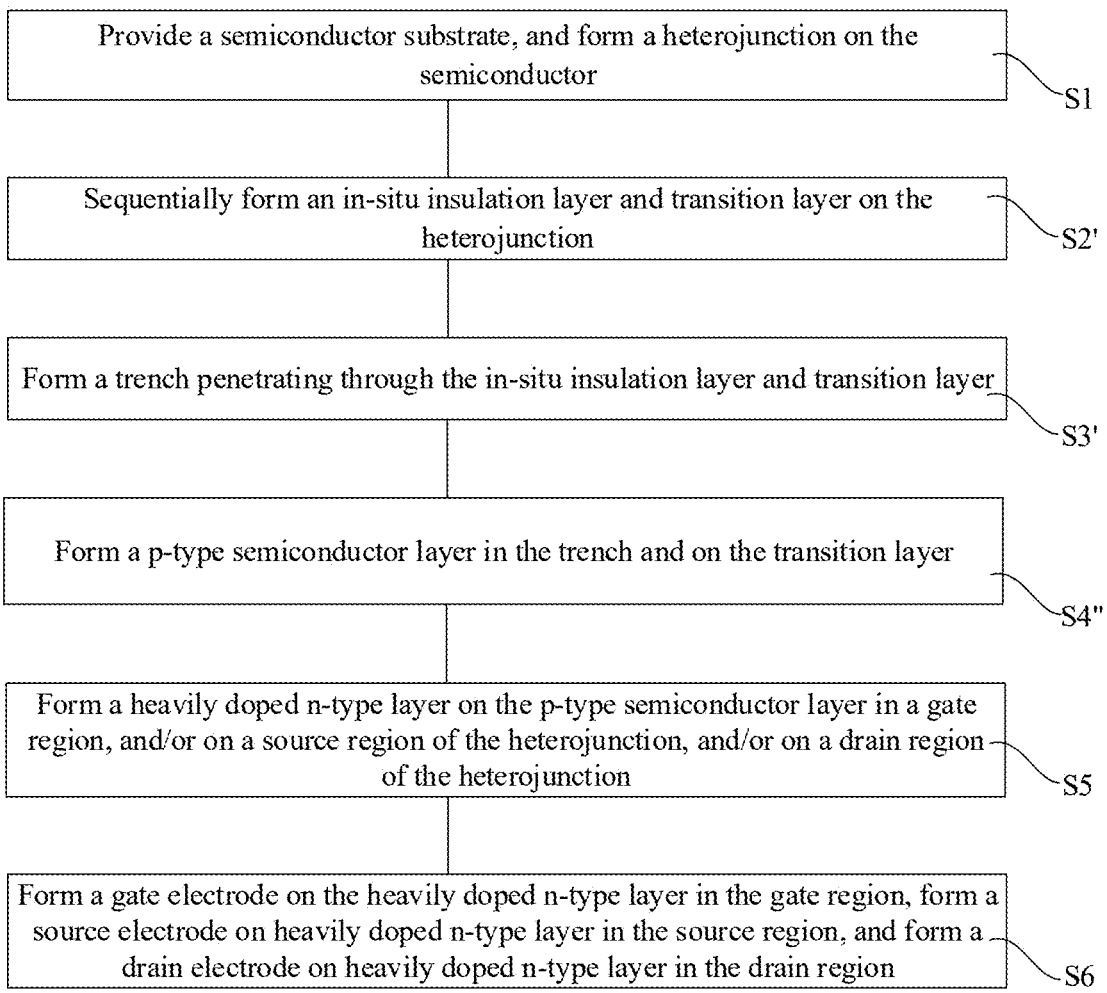
FIG. 11 is a flowchart of a method of manufacturing the semiconductor structure provided in the fifth embodiment of the present disclosure.
Figure 12:
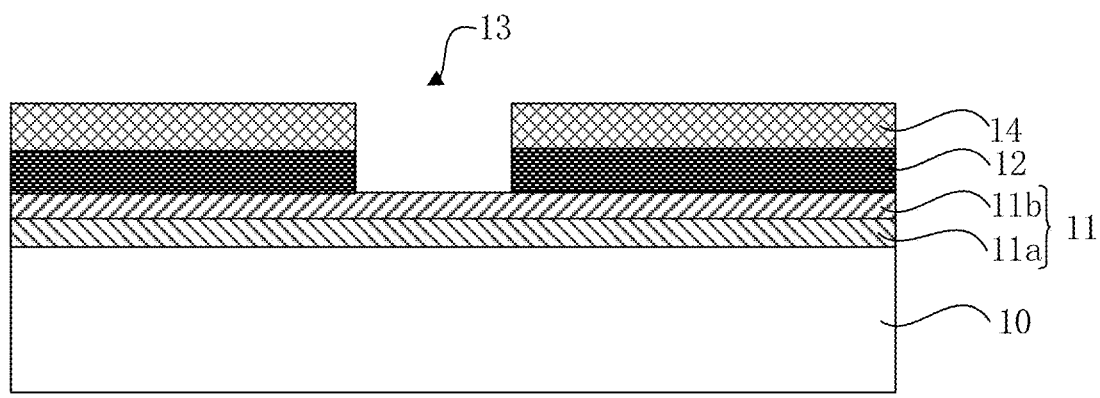
FIG. 12 is a schematic diagram illustrating an intermediate structure corresponding to the process of FIG. 11.

FIG. 10 is a structural diagram of a semiconductor structure according to a fifth embodiment of the present disclosure. FIG. 11 is a flowchart of a method of manufacturing the semiconductor structure provided by the fifth embodiment of the present disclosure. FIG. 12 is a schematic diagram illustrating an intermediate structure corresponding to the process of FIG. 11.

Referring to FIG. 10, the semiconductor structure 5 includes:

a semiconductor substrate 10, a heterojunction 11, an in-situ insulation layer 12 and a transition layer 14 disposed from bottom to top;

a trench 13 penetrating through the in-situ insulation layer 12 and the transition layer 14;

a p-type semiconductor layer 15 located in the trench 13 and on the transition layer 14;

a heavily doped n-type layer 16 located on the p-type semiconductor layer 15 in the gate region, and on the source region and the drain region of the heterojunction 11;

a gate electrode 17a located on the heavily doped n-type layer 16 in the gate region, a source electrode 17b located on the heavily doped n-type layer 16 in the source region, and a drain electrode 17c located on the heavily doped n-type layer 16 in the drain region.

Referring to FIG. 10, FIG. 12 and FIG. 1, the semiconductor structure 5 of the fifth embodiment is substantially the same as the semiconductor structure 1 of the first embodiment, the difference includes that the trench 13 penetrates through the in-situ insulation layer 12 and the transition layer 14, that is, the transition layer 14 is located on the in-situ insulation layer 12 outside the trench 13.

Correspondingly, referring to FIG. 11, FIG. 12 and FIG. 2, the manufacturing method of the semiconductor structure 5 of the fifth embodiment is substantially the same as the manufacturing method of the semiconductor structure 1 of the first embodiment, the difference includes that step S2' includes: the in-situ insulation layer 12 and the transition layer 14 are sequentially formed on the heterojunction 11; the step S3' includes: forming a trench 13 penetrating through the in-situ insulation layer 12 and the transition layer 14; the step S4" includes: forming a p-type semiconductor layer 15 in the trench 13 and on the transition layer 14.

In FIG. 10, the source electrode 17b and the drain electrode 17c are in contact with the barrier layer 11b, and an ohmic contact may be formed both between the source electrode 17b and the barrier layer 11b and between the drain electrode 17c and the barrier layer 11b by heavily doped n-type layer 16. An ohmic contact is also formed between the gate electrode 17a and the p-type semiconductor layer 15 by the heavily doped n-type layer 16. The heavily doped n-type layer 16 can make an ohmic contact layer be directly formed between the source electrode 17b and the source region of the heterojunction 11, between the drain electrode 17c and the drain region of the heterojunction 11, and between the gate electrode 17a and the p-type semiconductor layer 15 in the gate region, without high temperature annealing.

In some embodiments, an n-type ion heavily doped layer 16 may also be provided on at least one of the p-type semiconductor layer 15 in the gate region, the source region of heterojunction 11, or the drain region of the heterojunction 11. By high temperature annealing, an ohmic contact layer may be formed between the gate electrode 17a and the p-type semiconductor layer 15 in the gate region without the heavily doped n-type layer 16, between the source electrode 17b and the source region of the heterojunction 11 without the heavily doped n-type layer 16, and between the drain electrode 17c and the drain region of the heterojunction 11 without the heavily doped n-type layer 16.

In the semiconductor structure 5, the in-situ insulation layer 12 and the transition layer 14 can reduce the gate leakage current leaked from the channel to the gate electrode 17a, so the thickness of the barrier layer 11b in the heterojunction 11 can be smaller, which can decrease threshold voltage; in addition, because in-situ insulation layer 12 is provided, the sheet resistance can be reduced, the concentration of the two-dimensional electron gas is increased, and therefore the control ability of the gate to the channel is improved, and the working current is increased.

In addition, in the existing HEMT structure of the AlGaN barrier layer/GaN channel layer, the thickness of the barrier layer 11b is from 15 nm to 25 nm to ensure the generation of a sufficient concentration of two-dimensional electron gas. In the present disclosure, when the thickness of the barrier layer 11b range is from 1 nm to 15 nm, a sufficient concentration of two-dimensional electron gas can be generated. In an example, the thickness of the barrier layer 11b can be controlled to be less than 10 nm.

Figure 13:
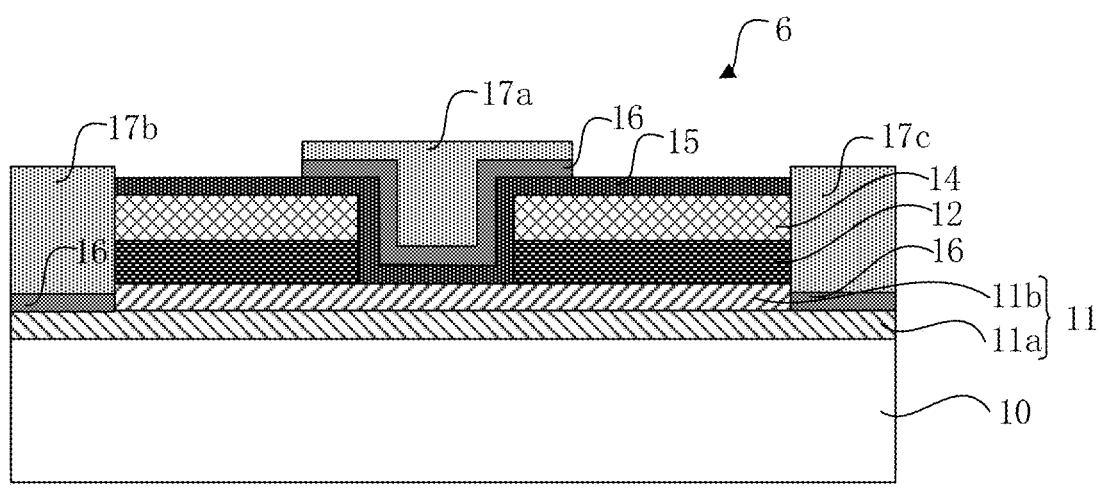
FIG. 13 is a structural diagram of a semiconductor structure according to a sixth embodiment of the present disclosure.

FIG. 13 is a structural diagram of a semiconductor structure according to a sixth embodiment of the present disclosure:

Referring to FIG. 13 and FIG. 10, the semiconductor structure 6 of the sixth embodiment is substantially the same as the semiconductor structure 5 of the fifth embodiment, except that the source electrode 17b and the drain electrode 17c are in contact with the channel layer 11a; and ohmic contact is formed, by using the heavily doped n-type ion layer 16, between the source electrode 17b and the channel layer 11a, and between drain electrode 17c and the channel layer 11a.

Correspondingly, the manufacturing method of the semiconductor structure 6 of the sixth embodiment is substantially the same as the manufacturing method of the semiconductor structure 5 of the fifth embodiment, the difference includes that in step S5, before the heavily doped n-type layer 16 is formed on the source region of the heterojunction 11 and the drain region of the heterojunction 11, the p-type semiconductor layer 15, the transition layer 14, the in-situ insulation layer 12 and the barrier layer 11b in the source region and the drain region are removed to expose the channel layer 11a. The heavily doped n-type layer 16 enables that an ohmic contact layer is directly formed without high temperature thermal annealing between the source electrode 17b and the channel layer 11a, and between the drain electrode 17c and the channel layer 11a.

In some embodiments, the source electrode 17b and the drain electrode 17c are in contact with the channel layer 11a, and ohmic contact is formed, by using the heavily doped n-type layer 16, between the source electrode 17b and the channel layer 11a, or between drain electrode 17c and the channel layer 11a. By high temperature annealing, an ohmic contact layer may be formed between the source electrode 17b and channel layer 11a without the heavily doped n-type layer 16, or between the drain electrode 17c and the channel layer 11a without the heavily doped n-type layer 16.

Figure 14:
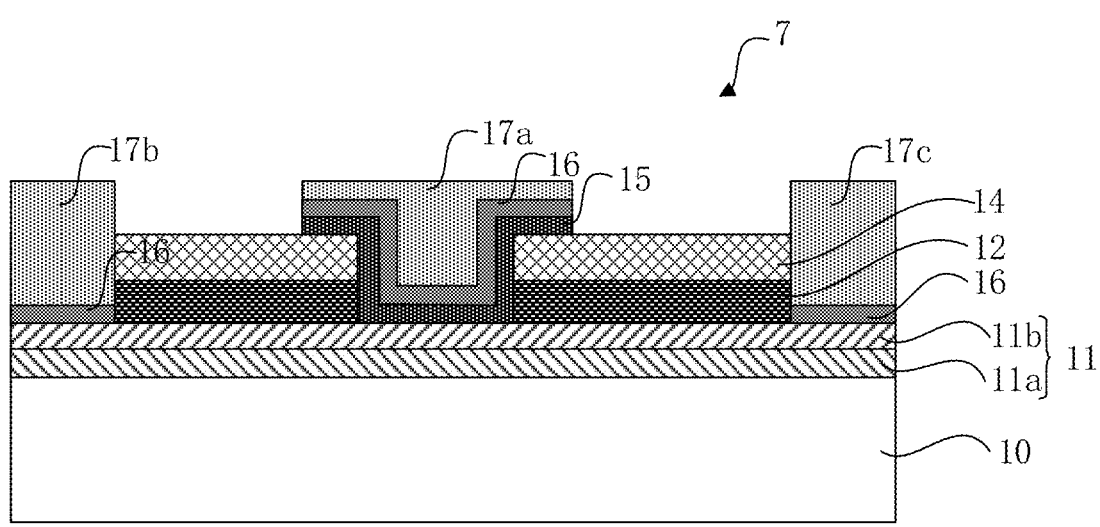
FIG. 14 is a structural diagram of a semiconductor structure according to a seventh embodiment of the present disclosure.

FIG. 14 is a structural diagram of a semiconductor structure according to a seventh embodiment of the present disclosure:

Referring to FIG. 14, FIG. 10 and FIG. 13, the semiconductor structure 7 of the seventh embodiment is substantially the same as the semiconductor structures 5 and 6 of the fifth and sixth embodiments, the difference includes that: on the transition layer 14, the p-type semiconductor layer 15 is provided in the gate region.

Correspondingly, the manufacturing method of the semiconductor structure 7 of the seventh embodiment is substantially the same as the manufacturing methods of the semiconductor structures 5 and 6 of the fifth embodiment and the sixth embodiment, and the difference includes that step S4" further includes a step of patterning the p-type semiconductor layer 15. In other words, step S4" includes: forming the p-type semiconductor layer 15 in the trench 13 and on the transition layer 14; patterning the p-type semiconductor layer 15 to only retain the p-type semiconductor layer 15 in the gate region.

Patterning p-type semiconductor layer 15 can be implemented by dry etching or wet etching. Compared with the method of patterning the p-type semiconductor layer 15 formed directly on the barrier layer 11b, the in-situ insulation layer 12 and the transition layer 14 can prevent the barrier layer 11b from being damaged by over-etching during the patterning process.

Figure 15:
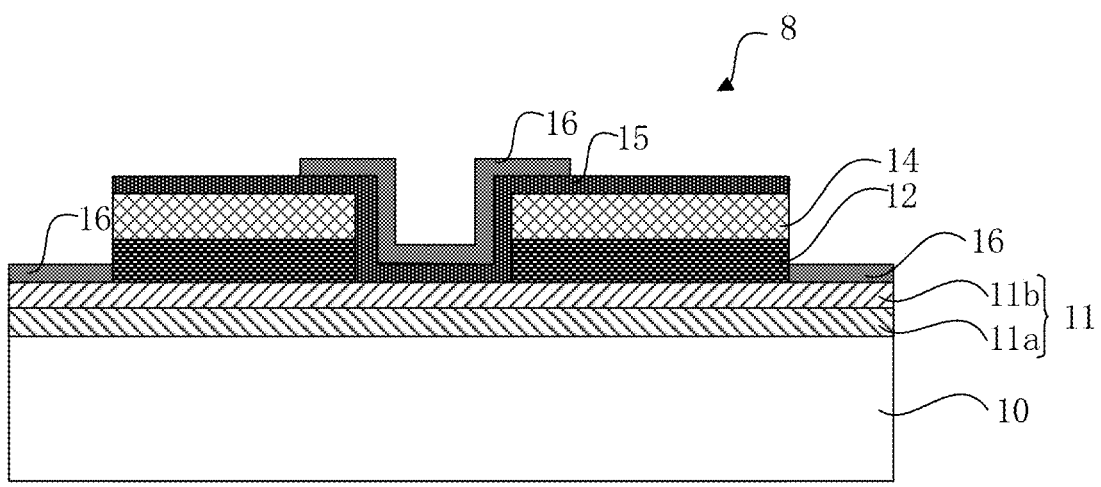
FIG. 15 is a structural diagram of a semiconductor structure according to an eighth embodiment of the present disclosure.

FIG. 15 is a structural diagram of a semiconductor structure according to an eighth embodiment of the present disclosure; Referring to FIG. 15, FIG. 10, FIG. 13 and FIG. 14, the semiconductor structure 8 of the eighth embodiment is substantially the same as the semiconductor structures 5, 6, and 7 of the fifth, sixth, and seventh embodiments, except that the semiconductor structure 8 is a semiconductor structure in progress, the gate electrode 17a, the source electrode 17b and the drain electrode 17c are not formed.

Correspondingly, the manufacturing method of the semiconductor structure 8 of the eighth embodiment is substantially the same as the manufacturing method of the semiconductor structures 5, 6, and 7 of the fifth, sixth, and seventh embodiments, and the difference includes that step S6 is omitted.

The semiconductor structure 8 can also be produced and sold as a semi-finished product.

Although the present disclosure discloses the above contents, the present disclosure is not limited thereto. One of ordinary skill in the art can make various variants and modifications to the present disclosure without departing from the spirit and scope of the present disclosure. Therefore, the protection scope of the present disclosure should be set forth by the appended claims.

The invention claimed is:

1. A semiconductor structure, comprising:
   a semiconductor substrate, a heterojunction, and an in-situ insulation layer disposed from bottom to top;
   a trench penetrating through the in-situ insulation layer;
   a transition layer completely covering an upper surface of the in-situ insulation layer away from the semiconductor substrate;
   a p-type semiconductor layer located in the trench and on a gate region of the transition layer, wherein, the p-type semiconductor layer is further provided on a region out of the gate region of the transition layer; and
   a heavily doped n-type layer located on the p-type semiconductor layer in the gate region, a source region of the heterojunction, and a drain region of the heterojunction.

2. The semiconductor structure according to claim 1, wherein, a material of the heavily doped n-type layer comprises a Group III nitride material.

3. The semiconductor structure according to claim 1, wherein, the transition layer is further located in the trench.

4. The semiconductor structure according to claim 1, wherein, the heterojunction comprises a channel layer and a barrier layer disposed from bottom to top.

5. The semiconductor structure according to claim 4, wherein the heavily doped n-type layer contacts the channel layer and the barrier layer.

6. The semiconductor structure according to claim 1, wherein the heterojunction comprises a Group III nitride material.

7. The semiconductor structure according to claim 1, wherein, at least one of:
   the in-situ insulation layer is a single-layer structure, wherein a material of the single-layer structure comprises: one of or a mixture of SiN and AlN; or the in-situ insulation layer is a multi-layer structure, wherein the multi-layer structure comprises a SiN layer and an AlN layer disposed from bottom to top, or comprises an AlN layer and a SiN layer disposed from bottom to top, or comprises a SiN layer, an AlN layer and a SiN layer disposed from bottom to top; or
   the transition layer is a single-layer structure, and a material of the single-layer structure comprises: one of or a mixture of two or more of AlN, SiAlN, and AlGaN; or the transition layer is a multi-layer layer, wherein the multi-layer structure comprises: at least two layers of an AlN layer, a SiAlN layer, or an AlGaN layer.

8. The semiconductor structure according to claim 1, further comprising: a gate electrode located on the heavily doped n-type layer in the gate region, a source electrode located on the heavily doped n-type layer in the source region, and a drain electrode on the heavily doped n-type layer in the drain region.

9. A method of manufacturing the semiconductor structure according to claim 1, comprising:
   providing the semiconductor substrate, wherein the heterojunction is formed on the semiconductor substrate;
   forming the in-situ insulation layer on the heterojunction;
   forming the trench penetrating through the in-situ insulation layer;
   forming the transition layer in the trench and completely covering an upper surface of the in-situ insulation layer away from the semiconductor substrate, and the p-type semiconductor layer on a gate region of and a region out of the gate region of the transition layer; and forming the heavily doped n-type layer on the p-type semiconductor layer in the gate region, the source region of the heterojunction, and the drain region of the heterojunction.

10. The method of manufacturing semiconductor structure according to claim 9, further comprising: patterning the p-type semiconductor layer, and retaining the p-type semiconductor layer in the gate region.

11. The method of manufacturing semiconductor structure according to claim 9, wherein, the heterojunction comprises a channel layer and a barrier layer disposed from bottom to top.

12. The method of manufacturing semiconductor structure according to claim 11, wherein the heavily doped n-type layer contacts the channel layer or the barrier layer.

13. The method of manufacturing semiconductor structure according to claim 9, wherein, at least one of:

the in-situ insulation layer is a single-layer structure, wherein a material of the single-layer structure comprises: one of or a mixture of SiN and AlN; or the in-situ insulation layer is a multi-layer structure, wherein the multi-layer structure comprises a SiN layer and an AlN layer disposed from bottom to top, or comprises an AlN layer and a SiN layer disposed from bottom to top, or comprises a SiN layer, an AlN layer and a SiN layer; or the transition layer is a single-layer structure, and a material of the single-layer structure comprises: one of or a mixture of two or more of AlN, SiAlN, and AlGaN; or the transition layer is a multi-layer layer, wherein the multi-layer structure comprises: at least two layers of an AlN layer, a SiAlN layer, or an AlGaN layer.

14. The method for manufacturing semiconductor structure according to claim 9, further comprising: forming a gate electrode on the heavily doped n-type layer in the gate region, forming a source electrode on heavily doped n-type layer in the source region, and forming a drain electrode on heavily doped n-type layer in the drain region.

\* \* \* \* \*